United States Patent
Allsop et al.

(10) Patent No.: US 8,143,145 B2
(45) Date of Patent: Mar. 27, 2012

(54) METHOD AND ARRANGEMENT FOR PRODUCING AN N-SEMICONDUCTIVE INDIUM SULFIDE THIN LAYER

(75) Inventors: Nicholas Allsop, Berlin (DE); Christian-Herbert Fischer, Berlin (DE); Sophie Gledhill, Berlin (DE); Martha Christina Lux-Steiner, Berlin (DE)

(73) Assignee: Helmholtz-Zentrum Berlin fuer Materialien und Energie GmbH, Berlin (DE)

( * ) Notice: Subject to any disclaimer, the term of this patent is extended or adjusted under 35 U.S.C. 154(b) by 0 days.

(21) Appl. No.: 12/934,329

(22) PCT Filed: Mar. 14, 2009

(86) PCT No.: PCT/DE2009/000353
§ 371 (c)(1),
(2), (4) Date: Dec. 8, 2010

(87) PCT Pub. No.: WO2009/121318
PCT Pub. Date: Oct. 8, 2009

(65) Prior Publication Data
US 2011/0081734 A1    Apr. 7, 2011

(30) Foreign Application Priority Data
Apr. 1, 2008   (DE) .................. 10 2008 017 077

(51) Int. Cl.
*H01L 21/36* (2006.01)
*H01L 21/20* (2006.01)
*H01L 21/76* (2006.01)
*H01L 21/469* (2006.01)

(52) U.S. Cl. ........ 438/478; 438/402; 438/479; 438/778; 257/E21.269; 257/E21.274; 257/E21.308

(58) Field of Classification Search ........... 257/E21.269, 257/E21.274, E21.308
See application file for complete search history.

(56) References Cited

U.S. PATENT DOCUMENTS
5,112,650 A    5/1992   Winter
(Continued)

FOREIGN PATENT DOCUMENTS
CA          2367342 A1   10/2000
(Continued)

OTHER PUBLICATIONS

Satoshi Tanimoto, et al., *Synchronously excited discrete chemical vapor deposition of Ta2o5*, Journal of the Electrochemical Society, vol. 141, Nr:5, p. 1339-1346, May 1994.
(Continued)

*Primary Examiner* — Mohsen Ahmadi
(74) *Attorney, Agent, or Firm* — Leydig, Voit & Mayer, Ltd.

(57) ABSTRACT

A method of producing, at atmospheric pressure, an n-type semiconductive indium sulfide thin film on a substrate using an indium-containing precursor, hydrogen sulfide as a reactive gaseous precursor, and an inert carrier gas stream includes cyclically repeating first and second steps so as to produce an indium sulfide thin film of a desired thickness. The first method phase includes converting the indium-containing precursor to at least one of a dissolved and a gaseous phase, heating the substrate to a temperature in a range of 100° C. to 275° C., directing the indium containing precursor onto the substrate and supplying hydrogen sulfide to the indium-containing precursor in a mixing zone in an amount so as to provide an absolute concentration of hydrogen sulfide that is greater than zero and no greater than 1% by volume. The indium concentration of the indium-containing precursor is set so as to produce a compact $In(OH_x, X_y, S_z)_3$ film, where X=halide and $x+y+2z=1$ with $z \neq 0$. The second step includes setting a temperature of the substrate in a range of 18° C. and 450° C. and directing hydrogen sulfide onto the substrate in an absolute concentration up to 100%.

19 Claims, 2 Drawing Sheets

U.S. PATENT DOCUMENTS

| | | | |
|---|---|---|---|
| 5,366,934 A * | 11/1994 | La Chapelle, Jr. | 438/694 |
| 5,376,409 A * | 12/1994 | Kaloyeros et al. | 427/248.1 |
| 5,451,260 A * | 9/1995 | Versteeg et al. | 118/725 |
| 5,480,818 A | 1/1996 | Matsumoto | |
| 2002/0172768 A1 | 11/2002 | Endo | |
| 2004/0079286 A1 * | 4/2004 | Lindfors | 118/715 |
| 2005/0287775 A1 | 12/2005 | Hasebe | |
| 2006/0269667 A1 | 11/2006 | Ma | |
| 2007/0169695 A1 | 7/2007 | Schneiders | |

FOREIGN PATENT DOCUMENTS

| | | |
|---|---|---|
| DE | 19831214 C2 | 9/1999 |
| DE | 19916403 C1 | 10/2000 |
| DE | 102005058869 A1 | 6/2007 |
| DE | 102008017077 A1 | 10/2009 |
| EP | 1717343 A2 | 11/2006 |
| JP | 2000144435 A | 5/2000 |
| WO | WO 9304212 A1 | 3/1993 |

OTHER PUBLICATIONS

T. Asikainen et al., *Growth of $In_2S_3$ Thin Films by Atomic Layer Epitaxy*, Appl. Surface Science 82/83, p. 122-125, 1994.

N. Naghavi et al., *High Efficiency Copper Indium Gallium Diselenide (CIGS) Solar Cells with Indium Sulfide Buffer Layers Deposited by Atomic Layer Chemical Vapor Deposition (ALCVD)*, Prog. Photovolt: Res. Appl. 2003; 11:437-443.

N.A. Allsop et al.: *Spray-IL GAR Indium Sulfide Buffers for $Cu(In, Ga)(S,Se)_2$ Solar Cells*, Prog. Photovolt: Res. Appl. 2005; 13:607-616.

N.A. Allsop et al.: *Indium Sulfide Thin Films Deposited by the Spray Ion Layer Gas Reaction Technique*, Thin Solid Films 513 (2006) 52-56.

Search Report for International App. No. PCT/DE2009/000353, mailed Aug. 6, 2009.

* cited by examiner

METHOD AND ARRANGEMENT FOR PRODUCING AN N-SEMICONDUCTIVE INDIUM SULFIDE THIN LAYER

CROSS REFERENCE TO RELATED APPLICATIONS

This application is a U.S. National Phase application under 35 U.S.C. §371 of International Application No. PCT/DE2009/000353, filed on Mar. 14, 2009, and claims benefit to German Patent Application No. DE 10 2008 017 077.1, filed on Apr. 1, 2008. The International Application was published in German on Oct. 8, 2009 as WO 2009/121318 A1 under PCT Article 21 (2).

FIELD

The present invention relates to a method for producing an n-type semiconductive indium sulfide thin film ($In_2S_3$) on a heated substrate at atmospheric pressure, using a two-source precursor including an indium-containing precursor ($PR_{In(g/lt)}$), hydrogen sulfide ($H_2S$) as a reactive gaseous precursor, and an inert carrier gas stream.

BACKGROUND

N-type semiconductive metal sulfide thin films are used as buffer layers between the window layer and the absorber layer in solar cells, thereby allowing a significant increase in efficiency. A "buffer layer" is understood to be a layer having a higher band gap than the adjacent semiconducting absorber layer. This higher band gap can be achieved by alloying or by suitable material selection. Recombination in the interface area of the pn junction is reduced by improved interface conditions and improved band-gap adjustment, leading to an increase in the open terminal voltage. CdS is an n-type semiconductor having a band gap of 2.4 eV and thus absorbs in the UV and visible regions of the solar spectrum. The thereby generated electron-hole pairs are not separated by the space charge region and, therefore, do not contribute to the current. The function of the buffer layer is varied and has not yet been unequivocally clarified in all details. This layer protects the absorber layer from damage and chemical reaction during the deposition of the transparent contact layer; e.g., a ZnO layer.

Increasingly, efforts are being made to substitute the toxic CdS layer by less toxic materials. In this connection, various variants of the CVD method are increasingly used, which also allows for good coverage of rough substrates. In particular, indium(III) sulfide ($In_2S_3$), which has an indirect band gap of 2 eV to 2.2 eV, is a promising candidate to replace the toxic CdS. Therefore, various methods for producing it have been described in the art. However, to date, CVD methods are not used for producing it because the materials to be used tend to form solid reaction products already in the gas phase, resulting in inhomogeneous films with poor coverage on the substrate.

Mainly two sequential methods are used for producing indium sulfide thin films. These are the ion layer gas reaction (ILGAR) method and the atomic layer chemical vapor deposition (ALCVD) method, also known as atomic layer epitaxy (ALE) and as atomic layer deposition (ALD). In the ALCVD method, individual layers of atoms of a precursor material are deposited (adsorbed) on a substrate and then caused to react with the second precursor. In the process, ordered stacked (epitaxial) layers of molecules are formed, which allow the production of extremely thin ("monomolecular") indium sulfide films. Through cyclic repetition, it is possible to deposit a plurality atomic layers one upon another. Due to this procedure, the process is inherently very slow and hardly suitable for producing films having thicknesses of several 10 nm on an industrial scale. Moreover, unreacted atoms of the first precursor in lower layers cannot be caused to undergo reaction later, and may therefore result in defects. In contrast, the ILGAR method does allow complete and thorough reaction of disordered layers of the first precursor material. In the ILGAR method, the first precursor material is completely dissolved in a solvent to form a homogeneous liquid phase, and is applied to the substrate by spraying or dipping, so that the ions of the first precursor material are uniformly adsorbed on the substrate in a disordered form. In the case of dipping, the solvent or residues thereof are removed by drying or evaporation, so that the thin, solid precursor layer can easily be accessed by the gaseous second precursor, which is added in the next step. In this manner, an efficient, thorough reaction of the entire film is achieved, which accurately follows the surface morphology of the substrate, so that even porous substrates can be efficiently covered. The film thickness can be adjusted by cyclically repeating these method steps, it being possible to influence the optical film properties in the process. However, in prior art film production methods, special care must be taken to prevent contact of the two precursors during the process, because otherwise premature reaction (i.e., powder formation) may occur in the gas phase, which would result in poor film adhesion and homogeneity, and thus in films of inferior quality. For this reason, thorough purging with an inert gas is carried out between the sequential steps of the method.

The use of ALCVD for producing $In_2S_3$ layers is described, for example, in T. Asikainen et al.: "Growth of $In_2S_3$ Thin Films by Atomic Layer Epitaxy" Appl. Surface Science 82/83 (1994) 122-125. This method uses $H_2S$ gas and $InCl_3$ which is evaporated at 275° C. from the solid phase and adsorbed on a substrate surface heated to 300° C. to 400° C. In N. Naghavi et al: "High Efficiency Copper Indium Gallium Diselenide (CIGS) Solar Cells with Indium Sulfide Buffer Layers Deposited by Atomic Layer Chemical Vapor Deposition (AL-CVD)" Prog. Photovolt: Res. Appl. 2003; 11:437-443, an ALCVD method for buffer layers of solar cells is described, in which indium acetylacetonate $In(acac)_3$ evaporated at 125° C. and $H_2S$ gas are used at substrate temperatures of 160° C. to 260° C. However, it is generally understood by those skilled in the art that such a method is far too slow and too expensive to be used for producing solar cells on an industrial scale.

WO 93/04212 A1 describes that preferably well-oriented crystalline thin films can be made from compounds of group III and group VI elements using a carrier-gas based, single source CVD process. However, in this method, temperatures between 350° C. and 650° C. are required to crack the organometallic compounds which are used as precursors and which first have to be prepared from metal halides or the like, which is complicated and expensive. Hydrogen sulfide may indeed be added to the carrier gas during the preparation of indium sulfide films; but no information is given on the amounts in which to add hydrogen sulfide. Rather, in the exemplary embodiments in which only argon carrier gas is used, no mention is made of adding hydrogen sulfide. U.S. Pat. No. 5,112,650 describes that in chemical vapor deposition of metal chalcogenide thin films, addition of hydrogen sulfide to the carrier gas is theoretically possible, but in practice not suitable in the case of insoluble metal sulfides, because it results in unwanted powder formation and, thus, inhomogeneous film formation.

The ILGAR method operates in an energy-efficient manner at ambient/atmospheric pressure and at a temperature which is dependent on the ion-exchange behavior of the materials used (typically ambient/room) temperature). This method is described in principle in DE 198 31 214 C2 (modification: sulfide formation by ILGAR via a hydroxide intermediate, DE 199 16 403 C1). The contents of the aforementioned documents are considered part of (and are incorporated by reference in) the disclosure of the present invention.

N. A. Allsop et al.: "Spray-ILGAR Indium Sulfide Buffers for Cu(In, Ga)(S,Se)$_2$ Solar Cells" Prog. Photovolt: Res. Appl. 2005; 13:607-616 ("ALLSOP 2005") and N. A. Allsop et al.: "Indium Sulfide Thin Films Deposited by the Spray Ion Layer Gas Reaction Technique", Thin Solid Films 513 (2006) 52-56 ("ALLSOP 2006") describe an ILGAR method including spray deposition of the dissolved precursor (spray ILGAR) for producing In$_2$S$_3$ buffer layers for use in chalcopyrite solar cells. In the ILGAR method generally described above, which includes strictly separate process steps (sequential method), indium chloride (InCl$_3$) is initially dissolved in ethanol and then atomized to form a spray (aerosol=mixture of liquid particles and air) using an ultrasonic generator. This spray is transported to the heated substrate with the aid of an inert nitrogen gas stream (N$_2$). To allow a good deposition rate, the substrate is at a temperature between 300° C. and 450° C. (see ALLSOP 2006, FIG. 2). In principle, however, efficient film formation occurs already at temperatures as low as 100° C. Especially when growing a buffer layer on an absorber layer, care must be taken that the absorber layer is not damaged and that the heating temperature is controlled at a level clearly below 300° C., typically between 175 and 250° C. The indium ions deposited on the substrate surface are then treated with hydrogen sulfide gas, so that the desired reaction to form In$_2$S$_3$ takes place on the substrate surface. In addition, purging with N$_2$ is carried out between each of the individual steps of the method to prevent contact of the two precursors in the gas phase.

The basic design of a system suitable for carrying out the above-described method can be seen from FIG. 1 of ALLSOP 2006. The valve shown there in the hydrogen sulfide supply line is a shut-off valve. This valve is opened only in the second sequential step of the method. This is when the first sequential step of the method is complete and the ultrasonic generator is off, so that no spray (aerosol) is produced anymore. In addition, purging with N$_2$ has been completed at this point, so that there is no material of the first precursor in the reaction vessel anymore. Thus, this shut-off valve serves to ensure a strictly sequential process and knows only the "open" and "closed" positions.

SUMMARY

In an embodiment, the present invention provides a method of producing, at atmospheric pressure, an n-type semiconductive indium sulfide thin film on a substrate using an indium-containing precursor, hydrogen sulfide as a reactive gaseous precursor, and an inert carrier gas stream, the method including cyclically repeating first and second steps so as to produce an indium sulfide thin film of a desired thickness. The first step includes converting the indium-containing precursor to at least one of a dissolved and a gaseous phase, heating the substrate to a temperature in a range of 100° C. to 275° C., and directing the indium containing precursor onto the substrate and supplying hydrogen sulfide to the indium-containing precursor in an amount so as to provide an absolute concentration of hydrogen sulfide that is greater than zero and no greater than 1% by volume in a mixing zone. The indium concentration of the indium-containing precursor is set so as to produce a compact In(OH$_x$,X$_y$,S$_z$)$_3$ film, where X=halide and x+y+2z=1 with z≠0. The second step includes setting a temperature of the substrate in a range of 18° C. and 450° C. and directing hydrogen sulfide onto the substrate in an absolute concentration up to 100%.

BRIEF DESCRIPTION OF THE DRAWINGS

Exemplary embodiments of the present invention are described in more detail below with reference to the drawings, in which.

DETAILED DESCRIPTION

In an embodiment, an aspect of the present invention is to improve the above-described ("spray ILGAR") method for producing indium sulfide thin films (In$_2$S$_3$) on a heated substrate using a sprayable, indium-containing precursor and hydrogen sulfide as a reactive gaseous precursor, and to do so in such a way that particularly homogeneous and compact indium sulfide films of constant quality can be produced, taking account of economic and ecological aspects, while at the same time further improving the material utilization and deposition rate. A system is provided to implement the improved method in a particularly simple and inexpensive manner.

In an embodiment of the method of the present invention, a spray ILGAR method is enhanced by a CVD process step, more specifically, by an atmospheric pressure chemical vapor deposition (APCVD) process step (CVD at atmospheric pressure), while maintaining its advantages mentioned in the publications cited above, a simultaneous process being carried out in the first phase of the method. The method still operates at atmospheric pressure throughout, which is unusual when using a CVD method because the materials used must have a sufficiently high vapor pressure (boiling point) for this purpose. As before, an ion-exchange reaction is brought about, but no longer exclusively on the substrate surface. Rather, partial sulfurization occurs already in the gas phase downstream of the mixing point. However, due to the parameter values selected, no powder formation occurs during the CVD step in the reaction vessel, which is at room temperature, but typically at a temperature below the substrate temperature. In this manner, the indium sulfide thin film produced is reliably prevented from deterioration caused by powder formation. Thus, the simultaneous CVD step during the first phase of the method has the positive effect of further improving the compactness and homogeneity of the indium sulfide thin film produced, while at the same time further improving the material utilization and increasing the deposition rate. A laminar gas flow over the substrate during the first phase of the method may further improve the quality of the film produced. A higher film growth rate makes it possible to achieve shorter cycle times and, thus, higher throughput during production. Because of this, in the case of in-line-processing, it is possible to reduce the number of cycles and, thus, the number of deposition units arranged in series. This makes it possible to produce more compact films with a lower residual halide content, in particular chlorine content, as compared to a pure CVD process.

For use in an embodiment of the method of the present invention, an indium-containing precursor is selected which either itself has a high vapor pressure or forms a volatile adduct with a suitable solvent. This precursor is initially dissolved and converted to an aerosol or to a gaseous phase. Subsequently, the dissolved precursor is sprayed as an aerosol on the substrate, which has been heated to a temperature equal to or between 100° C. and 275° C., or the gaseous precursor is directed (possibly in a laminar flow) onto the substrate, which has been heated to a temperature equal to or between 100° C. and 275° C., in each case with the carrier gas stream being involved, so that homogeneous solid indium compounds are deposited on the substrate surface. At the same time, in this phase of the method, hydrogen sulfide is added to the indium-containing precursor, which is either gaseous or dissolved and sprayed as an aerosol, and in such an amount that an absolute concentration of hydrogen sulfide of equal to or less than 1% by volume is obtained in the mixing zone. The indium concentration of the indium-containing precursor ($PR_{In(g/li)}$) is selected in relation thereto and such that a compact $In(OH_x,X_y,S_z)_3$ film is produced, where X=halide and x+y+2z=1 with z≠0.

The substrate temperature and the absolute concentration of the hydrogen sulfide gas are the relevant parameters to prevent unwanted powder formation in the reaction vessel and non-compact films. In an embodiment of the method of the present invention, appropriate adjustment of these two process parameters ensures that a reaction to form indium sulfide occurs only on or immediately above the heated substrate, so that solid indium sulfide is formed in a homogeneous and compact form exclusively on the substrate surface. Nevertheless, a reaction between hydrogen sulfide gas, on the one hand, and aerosol droplets or gaseous indium compound (see below) may occur already downstream of the mixing point. During direct deposition of the solid compound of the indium-containing precursor on the heated substrate surface (method phase I), a much smaller amount of the indium-containing precursor reacts with the sulfur from the hydrogen sulfide gas directly in front of or on the surface of the heated substrate. Thus, in addition to the direct deposition of the indium-containing precursor, a layer of still reactive indium ions in In(OH,X(Cl),S) compounds is deposited on the substrate. The notation X(Cl) indicates the preferred use of the halide chlorine. In this connection, deposition occurs in all cases in homogeneous form, because the moderate temperatures selected prevent a reaction in the reaction vessel. The simultaneous CVD step makes it possible to improve the material yield while increasing the film growth rate.

After completion of phase I of the method according to the present invention, which includes simultaneous, direct deposition of the indium-containing precursor (to a large extent) and reaction of the two precursors and deposition of the reaction products (to a lesser extent) on the substrate, the further procedure is carried out analogously to the known spray ILGAR method without modification. Method phase II, which sequentially follows the first, is carried out by supplying hydrogen sulfide onto the heated substrate in order to cause the indium compounds adsorbed on the substrate surface to undergo an ion-exchange reaction. This process is carried out without reducing the hydrogen sulfide supply rate. Instead, the hydrogen sulfide can be supplied in the maximum amount possible for the ion-exchange reaction. Since in method phase II, no more indium-containing precursor is present in the reaction vessel in the form of gas or aerosol, the substrate temperature may be controlled at a higher level without the risk of powder formation or deposition on the vessel walls, as is the case during the simultaneous CVD step. In order to increase the deposition rate, the substrate may be maintained at or heated to a temperature equal to or between room temperature and 450° C. However, care must be taken not to exceed the maximum temperature to which the substrate may be heated. However, raising the temperature to higher levels in method phase II than in method phase I is only useful if the substrate passes through different, thermally separated stations during the coating process and can easily be heated to different temperatures, respectively (in-line processing). In the case of batch processing, the substrate is stationary and, therefore, the use of temperature cycles, involving heating and cooling, would require significantly increased effort and complexity. Therefore, in batch processing, the substrate is constantly maintained at a temperature of up to 275° C., which is set for both method phases I and II and produces satisfactory results. All method steps may be cyclically repeated until a desired film thickness is reached. The achievable film thicknesses range from monomolecular to the μm range.

To carry out the method of the present invention, an indium-containing precursor is selected which either itself has a high vapor pressure or forms a volatile adduct with a suitable solvent and initially converted, said indium-containing precursor initially being converted to a dissolved or gaseous phase. In the reaction vessel, in method phase II, the dissolved (aerosol) or gaseous, indium-containing precursor is then, on the one hand, directed directly onto the heated substrate but, on the other hand, at the same time also mixed with hydrogen sulfide gas and the inert carrier gas stream. Depending on the state of aggregation of the precursor, a gas/liquid mixing point or a gas/gas mixing point is obtained. In the case where an indium-containing precursor in aerosol form is mixed with the gaseous one, the indium-containing precursor may advantageously be converted to the dissolved phase by dissolving it in a solvent. The solution may then be atomized using an ultrasonic generator or a pneumatic atomizer so as to produce a spray (aerosol) of extremely fine droplets. Alternatively, the indium-containing precursor may also be converted to a gaseous phase. This may preferably be accomplished by evaporation of the aerosol or by passing a solvent vapor over the indium-containing solid precursor. For example, ethanol vapors are produced by bubbling inert gas, such as $N_2$, through ethanol, and are then passed over solid $InCl_3$. In the process, a volatile $InCl_3$-ethanol adduct is obtained which, without addition of $H_2S$, decomposes on the substrate to form $InCl_3$ or In(X(Cl), O, OH), depending on the temperature, and deposits on the substrate. The reaction with $H_2S$ during the spraying phase results in In(OH,X(Cl),S) layers, which are converted to $In_2S_3$ in method phase II. Alternatively, conversion to the gaseous phase may also be accomplished by dissolution in a solvent and dripping of the solution onto a heated surface. The inert gas then flows over the heated surface and, as before, conveys the volatile precursor onto the heated substrate.

Further, the indium-containing precursor may preferably be a halide salt of indium. Examples of halides X (or halogens) include F, Cl, Br and I. The halide salt may preferably be a salt of indium chloride ($InCl_3$). Alternatively, the indium-containing precursor may also be a β-diketonate, preferably indium acetylacetonate ($In(acac)_3$). Furthermore, generally speaking, the solvent may be an alcohol, preferably ethanol, or a ketone, preferably acetone. Finally, the carrier stream used is preferably a nitrogen carrier stream ($N_2$).

One advantage of embodiments of the method of the present invention is that it can be carried out entirely at atmospheric pressure (ambient pressure). Therefore, there is no need for sealed reaction vessels or vacuum pumps, which allows for easy implementation of continuous flow (in-line systems). Analogously to the ambient pressure, the temperature prevailing in the reaction vessel is preferably ambient temperature (room temperature). The supply of the reaction energy needed to form indium sulfide is accomplished mainly by heating of the substrate, so that the corresponding chemical reaction occurs directly on the surface of the substrate or immediately in front of it. Depending on which of the above-mentioned materials are used (g=gaseous, li=liquid, s=solid), the overall reactions are as follows:

a. $2\ InCl_{3(g/li)} + 3\ H_2S_{(g)} \Rightarrow In_2S_{3(s)} + 6\ HCL_{(g)}$ or     b. $2\ In(acac)_{3(g/li)} + 3\ H_2S_{(g)} \Rightarrow In_2S_{3(s)} + 6\ HacaC_{(g)}$ In the process, the following intermediate steps may occur, and corresponding intermediates may be formed (indium is trivalent and can form compounds of different valence):

Method phase I

1. $2\ InCl_{3(g/li)} + EtOH \rightarrow In_xX_y$ (X=halide)
2. $In_xX_y + H_2S \rightarrow In_xZ_z$ (Z contains S)
3. $In_xZ_z + In_xX_y + heat \rightarrow In(OH,X(Cl),S)_{(s)}$ Method phase II $In(OH,X(Cl),S)_{(s)+H2S} \rightarrow In_2S_{3(s)}$ Moderate preheating of the mixture of hydrogen sulfide ($H_2S$) and the carrier gas stream accelerates the reaction, and thus the deposition or growth rate.

However, in the method of the present invention, the heating temperature can be selected such that a given substrate (e.g., an absorber layer) is not deteriorated or destroyed. If the substrate can be freely chosen, it is possible to predetermine the heating temperature and then select the substrate accordingly. Thus, for example, $TiO_2$, $CuInS_2$, $CuGaSe_2$, chalcopyrites in general, plastic, metals or glass may be used as the substrate.

Monitoring of the relevant parameters during the simultaneous CVD step in the first method phase may be accomplished by in-situ measurements. In addition to continuously measuring and controlling the substrate and precursor temperatures, in-situ optical measurements of aerosols used may advantageously be performed to determine concentrations. This primarily ensures that the CVD occurs without powder formation. Moreover, when in-situ optical reflectance measurements are advantageously performed to determine the thickness of the grown indium sulfide film, the film thickness may be measured in-situ and controlled during film growth. Such measurements allow various control procedures to be applied and integrated in the process sequence so as to achieve optimum indium sulfide films, for example, for use as buffer layers in solar cells.

Further details of the method of the present invention, and of preferred systems for carrying out the method in batch or in-line mode, may be inferred from the detailed description given below.

The method according to the exemplary embodiment of the present invention is subdivided into two phases:

Method Phase I

In method phase I, the two precursors $PR_{H2S(g)}$, $PR_{In(g/li)}$ and inert gas IG are supplied simultaneously. All components used flow over substrate SU during method phase I. Second precursor $PR_{In(g/li)}$ may be supplied in dissolved form as an aerosol (li) or in the gaseous state (g); first precursor $PR_{H2S(g)}$ is always supplied in the gaseous state (g). In reaction vessel TG, the dissolved or gaseous second precursor $PR_{In(g/li)}$ is, on the one hand, directed directly onto substrate SU, which has been heated to a temperature equal to or between 100° C. and 275° C., but, on the other hand, said second precursor is at the same time also mixed directly with first precursor $PR_{H2S(g)}$ in the form of hydrogen sulfide gas and the inert carrier gas stream IG. Depending on the state of aggregation of the precursor, a gas/liquid mixing zone MP or a gas/gas mixing zone MP is obtained. In the case where a dissolved second precursor $PR_{In(li)}$ is mixed with gaseous precursor $PR_{H2S(g)}$, second precursor $PR_{In(li)}$ may be converted to the dissolved phase by dissolving it in a solvent. The solution is then atomized using an ultrasonic generator or a pneumatic atomizer so as to produce a spray (aerosol) of extremely fine droplets (not specifically shown in FIG. 1). Alternatively, second precursor $PR_{In(g)}$ may also be converted to a gaseous phase. This may be accomplished by passing a solvent vapor over an indium-containing solid (s) precursor. For example, ethanol vapors are produced by bubbling inert gas, such as $N_2$, through ethanol, and are then passed over solid $InCl_3$. In the process, a volatile $InCl_3$-ethanol adduct is obtained which decomposes on the substrate to form $InCl_3$ or $In(X(Cl), O, OH)$, depending on the temperature, and deposits on the substrate. The reaction with $H_2S$ during the spraying phase results in $In(OH,X(Cl),S)$ layers, which are converted to $In_2S_3$ in the second method step. Alternatively, conversion to the gaseous phase may also be accomplished by dissolution in a solvent and dripping of the solution onto a heated surface. The inert gas then flows over the heated surface and, as before, conveys volatile precursor $PR_{In(g)}$ onto the substrate (not specifically shown in FIG. 1).

Figure 1:
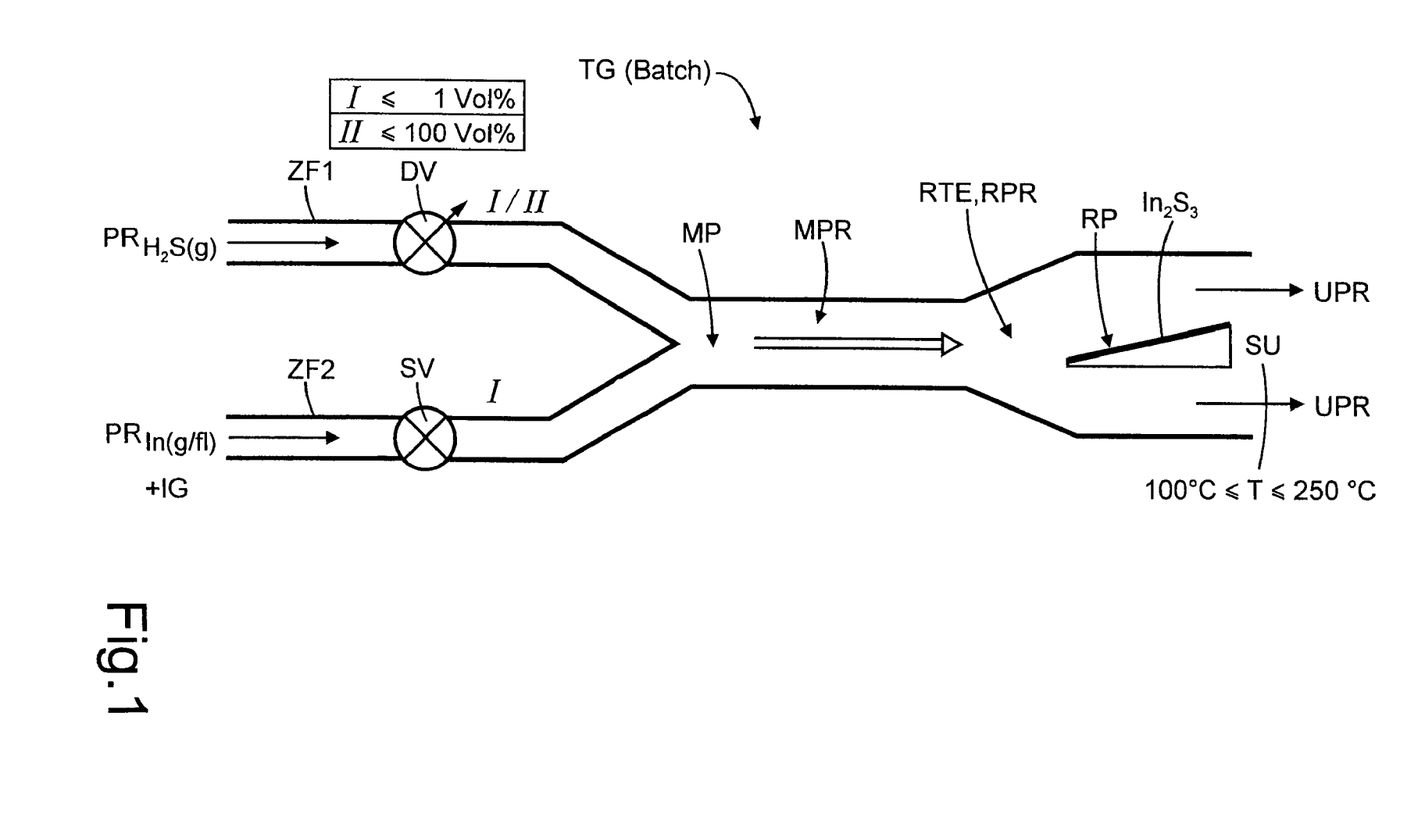
FIG. 1 shows batch processing of a method in accordance with an embodiment of the invention.

Second precursor $PR_{In(li)}$ is supplied in an unregulated manner in the maximum amount that may be supplied. First precursor $PR_{H2S(g)}$ is supplied simultaneously. In the process, the supply of the gaseous precursor $PR_{H2S(g)}$ is controlled by control valve DV in such a way that an absolute concentration of hydrogen sulfide $H_2S$ of equal to or less than 1% by volume is obtained in mixing zone MP. Since the rate of supply is regulated, a small fraction of the indium ions of second precursor $PR_{In(g/li)}$ may already react with the sulfur of first precursor $PR_{H2S(g)}$ in the vapor phase downstream of the mixing point to form the above-mentioned intermediates, and to form indium sulfide $In_2S_3$ on or closely above substrate SU, resulting in the formation of an $In(OH,X(Cl),S)$ layer. The deposition rate is determined by the concentrations of gaseous precursor $PR_{H2S(g)}$ and second precursor $PR_{In(g/li)}$, and by the temperature of mixed precursor MPR forming in mixing zone MP upstream of heated substrate SU.

Due to the selected parameters (pressure is ambient pressure RPR; i.e., atmospheric pressure (the mean atmospheric pressure at sea level is 1013.25 mbar with a variation from 869.9 mbar to 1085.7 mbar), and the temperature in reaction vessel TG in the region outside substrate SU is ambient temperature RTE (i.e., room temperature, for example 18° C. to 22° C.), there is no premature reaction and, thus, no powder formation. Rather, mixed precursor MPR is transported to substrate SU, whose surface was heated to a temperature T between 100° C. and 275° C. Thus, a reaction zone RP is created on or immediately above substrate SU, in which reaction zone the two precursors $PR_{H2S(g)}$ and $PR_{In(g/li)}$ and/or intermediates react with each other, contributing to the formation of the desired compact and homogeneous $In(OH,X(Cl),S)$ layer on substrate SU. Undeposited reaction products UPR are removed and collected downstream of substrate SU and may be recycled.

Method Phase II

Here, only the first, gaseous precursor $PR_{H2S(g)}$ is supplied, either with or without carrier gas IG being involved. The hydrogen gas undergoes an intensive ion-exchange reaction with the $In(OH,X(Cl), S)$ layer previously deposited on substrate SU and the deposited, indium-containing solid precursor $PR_{In(s)}$. In this method phase II, the substrate may be maintained at or heated to a temperature T equal to or between room temperature and 450° C. to enable an optimal, thorough reaction. Moderate heating increases the deposition rate. Unconverted reaction products UPR are removed and may be recycled. Typically, further cycles, each including the two method phases I and II, are performed until the desired film thickness is reached.

Example of the Synthesis and Deposition of Indium Sulfide

Method Phase I

Indium chloride $InCl_3$ is a solid having a low vapor pressure; i.e., a very high melting point and boiling point (586° C.). In order to make this material processable by APCVD, it must be converted into an adduct of higher volatility by, for example, using an alcohol. Therefore, indium chloride $InCl_3$ is initially dissolved (to a concentration of 25 mM) in ethanol (alternatively in acetone, alternatively $In(acac)_3$ in ethanol). Then, this solution is atomized at a rate of 1 ml/min. The resulting aerosol is transported by a nitrogen carrier gas stream at a flow rate of 5 l/min and mixed with a gas stream of 5% by volume of $H_2S$ in Ar, which is injected at a rate of 15 ml/min. An absolute $H_2S$ concentration of 0.015% by volume is obtained, which is significantly below 1% by volume (very low $H_2S$ concentrations of below 0.001 Vol % can also be used and provide considerable improvements to the process). Mixed precursor MPR, which includes carrier gas IG, aerosol (indium-containing precursor $PR_{In(g/li)}$ and reactive gas (gaseous precursor $PR_{H2S(g)}$) (and possibly sulfur-containing intermediates), is then directed onto heated substrate SU, which is at a temperature T=200° C. After 1 min, method phase I is stopped.

Method Phase II

Exposure to $H_2S$ (15 ml/min, concentration 5 vol. %, 60 s)
Repetition of Both Method Phases I, II Then, a compact film of indium sulfide $In_2S_3$ forms on heated substrate SU at a growth rate of 5.4 nm/min.

Under equal conditions, but without using $H_2S$ during method phase I (spray ILGAR only), a growth rate of only 2.2 nm/min is achieved. When using $H_2S$ during method phase I (invention) and moderately preheating the reaction vessel and/or the components used to up to 80° C., a growth rate of 15.8 nm/min is achieved.

Finally, it should be noted that the indium sulfide film also contains chlorine ($In_2(S_xCl_{2y})_3$ where x+y=1). However, this chlorine content does not negatively affect the quality of the manufactured film, even when the film is used as a buffer layer in a solar cell.

Systems vor Carrying Out the Method for the Deposition of Indium Sulfide

FIG. 1 shows a reaction vessel TG, which is used as a batch reactor containing a stationary substrate SU to carry out the method of the present invention at atmospheric pressure. The materials used are a first precursor $PR_{H2S(g)}$ in the form of hydrogen sulfide gas $H_2S$ and a second precursor $PR_{In(g/li)}$, which contains indium In and may be gaseous or dissolved. Second precursor ($PR_{In(g/li)}$) either itself has a high vapor pressure or forms a volatile adduct with a solvent. First precursor $PR_{H2S(g)}$ is supplied via a control valve DV provided in a first supply line ZF1 to allow the supply of hydrogen sulfide gas to be adjusted in a controlled manner. Second precursor $PR_{In(g/li)}$ is supplied in a predetermined amount via a shut-off valve SV provided in a second supply line ZF2 for turning on or shutting off the supply. Moreover, an inert gas stream IG is supplied at a feed point which may be located not only at the position shown, but also at any other suitable position. For example, this feed point may coincide with one of the two other feed points ZF. Inert gas stream IG may be supplied of the method without passing through a valve in each phase of the method. However, since the inert gas stream is primarily used to transport the aerosol (dissolved second precursor $PR_{In(g/li)}$ in the form of a spray of droplets) and in method phase I, it is preferably supplied together with the aerosol via shut-off valve SV.

In method phase I, the two precursors $PR_{H2S(g)}$, $PR_{In(g/li)}$ are mixed in mixing zone MP and directed onto the surface of heated, stationary substrate SU, on which reaction zone RP is created in method phase II. Unused reaction products URP are removed downstream of substrate SU.

Figure 2:
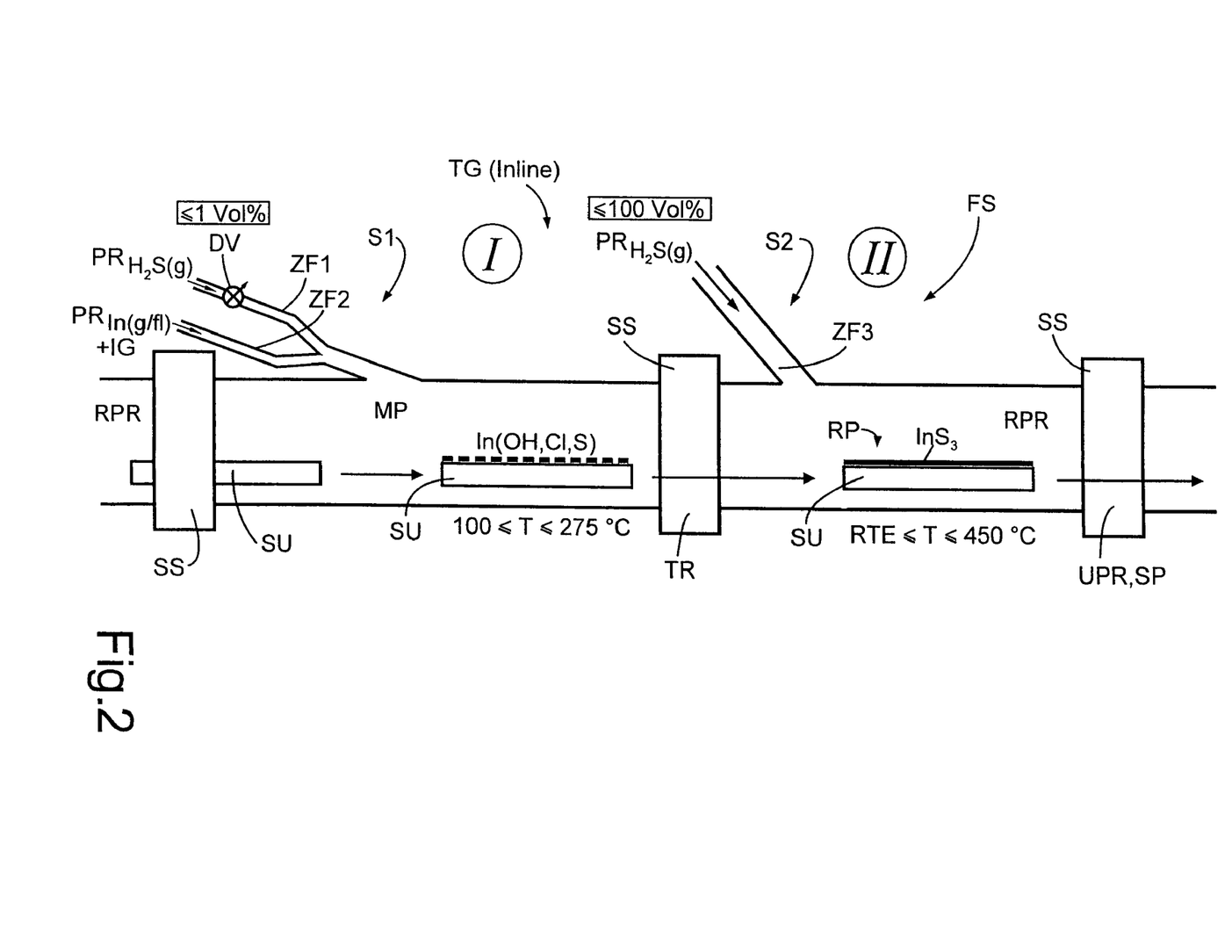
FIG. 2 shows line processing of a method in accordance with an embodiment of the invention.

FIG. 2 shows a reaction vessel TG, which is designed as in-line reactor containing a substrate SU movable along a processing path FS, and is used to carry out the method of the present invention at atmospheric pressure. At a first station Si of processing path FS, there is provided a first supply line ZF1 having a control valve DV for first precursor $PR_{H2S(g)}$, and a second supply line ZF2 for at least the second precursor $PR_{In(g/li)}$. Inert gas stream IG may also be supplied via second supply line ZF2. First Precursor $PR_{H2S(g)}$ is supplied in an accurately metered amount so as to prevent powder formation in the gas phase. Mixing zone MP is formed directly above heated substrate SU, which is heated to a temperature T equal to or between 100° C. and 275° C. An In(OH,X(Cl),S) layer deposits on substrate SU.

At a second station S2, there is provided a third supply line ZF3 for first $PR_{H2S(g)}$ in the form of hydrogen sulfide ($H_2S$). No valve is needed here because $H_2S$ can be supplied in the maximum amount possible. Second station S2 is disposed at such a distance downstream of first station S1 that a maximum amount of second precursor $PR_{In(g/li)}$ may be deposited on the substrate surface at station S1. In second station S2, substrate SU may be maintained at or heated to a temperature T equal to or between room temperature and 450° C. (up to 275° C. for solar cells) (cooling is also possible without problems). The deposited indium ions then also react with the hydrogen sulfide $H_2S$ to form indium sulfide $In_2S_3$. This, together with the deposition in first station S1, gives rise to the formation of a homogeneous and particularly compact indium sulfide film $In_2S_3$ which is particularly suitable for use as a buffer layer in solar cells.

Between stations S1, S2, transfer ports SS are provided for gas isolation TR of substrate SU and removal SP of unconverted starting products and undesired reaction products UPR. This arrangement may be repeated multiple times along a processing line to achieve predetermined film thicknesses.

While the invention has been particularly shown and described with reference to preferred embodiments thereof, it will be understood by those skilled in the art that various changes in form and details may be made therein without departing from the spirit and scope of the invention.

LIST OF REFERENCE CHARACTERS

DV control valve
f s, solid
fl li, liquid
g gaseous
IG inert gas stream
MP mixing zone
MPR mixed precursor
$PR_{H2S(g)}$ first precursor ($H_2S$)
$PR_{In(g/fl)}$, $PR_{In(g/li)}$, second precursor (contains In)
RP reaction zone (on and immediately above SU)
RPR ambient pressure
RTE ambient temperature
S station
SP purging
SS transfer port SU substrate
SV shut-off valve
T temperature
TG reaction vessel
TR gas isolation
UPR undeposited reaction products
X halide
Z sulfur-containing compound
ZF supply line
x,y,z stoichiometric indices

What is claimed is:

1. A method of producing an n-type semiconductive indium sulfide thin film on a substrate using an indium-containing precursor, hydrogen sulfide as a reactive gaseous precursor, and an inert carrier gas stream, the method being carried out at atmospheric pressure and comprising:
   a) converting the indium-containing precursor to at least one of a dissolved and a gaseous phase,
      heating the substrate to a temperature in a range of 100° C. to 275° C., and
      directing the converted indium containing precursor onto the substrate and supplying hydrogen sulfide to the indium-containing precursor in an amount so as to provide an absolute concentration of hydrogen sulfide that is greater than zero and no greater than 1% by volume in a mixing zone,
      wherein the indium concentration of the indium-containing precursor is set so as to produce a compact $In((OH)_x,X_y,S_z)_3$ film, where X=halide and $x+y+2z=1$ with $z\neq 0$,
   b) setting a temperature of the substrate in a range of 18° C. and 450° C., and
      directing onto the substrate hydrogen sulfide in an absolute concentration up to 100%; and
   cyclically repeating steps a) and b) so as to produce an indium sulfide thin film of a desired thickness.

2. The method as recited in claim 1, wherein the indium-containing precursor has a vapor pressure that facilitates the converting of the indium-containing precursor to the at least one of a dissolved and a gaseous phase.

3. The method as recited in claim 1, wherein the indium-containing precursor forms a volatile adduct with a solvent.

4. The method as recited in claim 1, wherein in step a) the indium-containing precursor and hydrogen sulfide are directed in a laminar flow over the substrate.

5. The method as recited in claim 1, wherein the converting the indium-containing precursor to at least one of a dissolved and a gaseous phase includes dissolving the indium containing precursor in a solvent so as to form a solution and atomizing the solution with at least one of an ultrasonic generator and a pneumatic atomizer so as to produce an aerosol of extremely fine droplets in air.

6. The method as recited in claim 1, wherein the converting the indium-containing precursor to at least one of a dissolved and a gaseous phase includes providing the indium-containing precursor as a solid and passing a solvent vapor over the indium-containing precursor so as to convert the indium-containing precursor to the gaseous phase.

7. The method as recited in claim 1, wherein the converting the indium-containing precursor to at least one of a dissolved and a gaseous phase includes dissolving the indium containing precursor in a solvent so as to form a solution and dripping the solution onto a heated surface so as to convert the indium-containing precursor to the gaseous phase.

8. The method as recited in claim 1, wherein the indium-containing precursor includes at least one of a halide salt of indium and a solvent adduct of the halide salt.

9. The method as recited in claim 8, wherein the β-diketonate is indium acetylacetonate ($In(acac)_3$).

10. The method as recited in claim 8, wherein the halide salt is indium chloride $InCl_3$.

11. The method as recited in claim 1, wherein the indium-containing precursor includes a β-diketonate.

12. The method as recited in claim 1, wherein the solvent includes at least one of an alcohol and a ketone.

13. The method as recited in claim 1, wherein the solvent includes at least one of an ethanol and an acetone.

14. The method as recited in claim 1, wherein the carrier gas stream is $N_2$.

15. The method as recited in claim 1, wherein a vicinity surrounding the heated substrate is at room temperature.

16. The method as recited in claim 1, further comprising preheating at least one of the hydrogen sulfide and a mixture of the hydrogen sulfide, indium-containing precursor and carrier gas stream.

17. The method as recited in claim 1, wherein the substrate includes at least one of $TiO_2$, $CuInS_2$, $CuGaSe_2$, a chalcopyrite, metal and glass.

18. The method as recited in claim 1, further comprising performing an in-situ optical concentration measurement so as to determine concentrations of constituent fractions of aerosols directed to the substrate.

19. The method as recited in claim 1, further comprising performing an in-situ optical reflectance measurement so as to determine a thickness of the produced indium sulfide thin film.

* * * * *